United States Patent [19]

Homma et al.

[11] Patent Number: 4,717,462
[45] Date of Patent: Jan. 5, 1988

[54] SPUTTERING APPARATUS

[75] Inventors: Yoshio Homma, Hinode; Sukeyoshi Tsunekawa, Tokorozawa; Shunji Sasabe, Iruma, all of Japan

[73] Assignee: Hitachi, Ltd., Tokyo, Japan

[21] Appl. No.: 922,892

[22] Filed: Oct. 24, 1986

[30] Foreign Application Priority Data

Oct. 25, 1985 [JP] Japan ................................ 60-237258

[51] Int. Cl.$^4$ .............................................. C23C 14/00
[52] U.S. Cl. .............................. 204/298; 204/192.15; 204/192.23; 204/192.25
[58] Field of Search ......................................... 204/298

[56] References Cited

U.S. PATENT DOCUMENTS

| 3,730,873 | 5/1973 | Pompei | 204/298 |
| 3,968,019 | 7/1976 | Hanazono et al. | 204/298 |
| 4,158,589 | 6/1979 | Keller et al. | 204/298 |
| 4,318,796 | 3/1982 | Nishiyama et al. | 204/298 |
| 4,395,323 | 7/1983 | Denton et al. | 204/298 |
| 4,426,274 | 1/1984 | Ephrath | 204/298 |
| 4,540,466 | 9/1985 | Nishizawa | 204/298 |
| 4,572,759 | 2/1986 | Benzing | 204/298 |
| 4,579,618 | 4/1986 | Celestino et al. | 204/298 |
| 4,581,118 | 4/1986 | Class et al. | 204/298 |
| 4,624,767 | 11/1986 | Obinata | 204/298 |

Primary Examiner—Arthur P. Demers
Attorney, Agent, or Firm—Antonelli, Terry & Wands

[57] ABSTRACT

A sputtering apparatus comprising an intermediate electrode having a plurality of openings disposed between a cathode and a substrate electrode.

The directionality of the particles which are liberated from a target by the collision of ions against the target is made remarkably uniform by the presence of the intermediate electrode, and thus a thin film having a superior step coverage can be deposited on the substrate placed on the substrate electrode.

11 Claims, 4 Drawing Figures

SPUTTERING APPARATUS

BACKGROUND OF THE INVENTION

The present invention relates generally to a sputtering apparatus, and more particularly to a sputtering apparatus which enables the deposition of a thin metallic film which has superior step coverage.

As is well known, in the production of semiconductor integrated circuits, bubble memory elements and the like, a deposition method, such as vacuum evaporation, sputtering or CVD (Chemical Vapor Deposition), is employed in order to form various types of thin films. Of these methods, sputtering has an advantage in that it has the capability of forming a high -melting-point metal film and a thin film with a composition similar to that of a target and with a sufficient uniformity. Therefore, sputtering deposition is widely used for the formation of various kinds of metal or alloy films such as W, Mo or Al-Si alloy, or of an insulating film such as $SiO_2$, $Al_2O_3$ or $Ta_2O_5$. Furthermore, since sputtering is advantageous in that the impurity content of the deposited film is extremely small, this method has replaced conventional vacuum evaporation for the purpose of forming a film of a metal having a relatively low melting point, such as Al.

In spite of the above-described large advantages, sputtering has the disadvantage of an inferior step coverage.

More specifically, sputtering is a deposition process in which $Ar^+$ ions are made to collide against a target made of the same material as that of the thin film to be deposited, so as to make particles sputter out of the target, and the thus-sputtered particles are deposited on a silicon substrate which is so disposed as to face the target. Since the target has a relatively large area, the sputtered particles are dispersed in random directions. For this reason, although a large number of metal particles are deposited on the flat surface of the silicon substrate and a suitable film is thereby formed thereon, only a small number of metal particles are deposited within any minute recesses or grooves which may exist in the substrate surface. Therefore, it is difficult to properly cover or fill the minute recesses or grooves in the substrate surface with sputtered particles. In particular, as the integration density of semiconductor devices has increased, such recesses and grooves have become greatly reduced in width. However, since the depth of these recesses and grooves has not substantially altered (hence, their aspect ratios, i.e., their depth/width ratios have increased), it is extremely difficult to satisfactorily fill the recesses and grooves with metal vapor by sputtering.

To solve the above-described problem, a process called bias sputtering has been proposed.

This process usually employs an apparatus such as shown in FIG. 1. As illustrated in FIG. 1, a cathode 11 is connected to a direct-current or high-frequency electric power source (not shown in the drawing). A gas such as Ar is introduced into a vacuum chamber 10, and the cathode 11 is negatively biased by the application of an electric voltage to the cathode 11, thereby causing a glow discharge. The Ar ions generated by the glow discharge are incident on the surface of the cathode 11 and etch a target 13 placed on a surface of the cathode 11. When a shutter 14 is released, the particles of the etched target 13 are directed toward a substrate electrode 12, and are thus deposited on a silicon substrate 16 placed on the substrate electrode 12. During this time, if a high-frequency voltage is applied to the substrate electrode 12 as well, the Ar ions are also made to be incident on a substrate electrode 12, so that some of the particles deposited on the surface of the silicon substrate 16 are etched again (hereinafter referred to as the "re-sputtering effect"). The ratio of the amount of reetched particles to that of the particles deposited on the silicon substrate 16 is hereinafter referred to as the "resputtering rate".

The use of the above-described bias sputtering process provides the advantage of flattening the surface of the deposited film and greatly improving the step coverage. In addition, as set forth in Ext. Absts. ECS 164th Meeting, p.438, 1983, the use of a planar magnetron cathode as the cathode 11 enables great improvements in the deposition rate of particles, while the flattening effect is maintained to the same extent.

However, it has been found that such a bias sputtering process has the following two drawbacks. The problem lies in the fact that the formation of a thin film must be carried out with a fairly high resputtering ratio in order to achieve a sufficient flattening effect and good step coverage. When the resputtering ratio is low, voids are occasionally produced within the deposited film, as shown in unexamined Japanese patent publication No. 170258/1984 which has already been laid open to public inspection in Japan. Conversely, if the resputtering ratio is increased to prevent the occurrence of these voids, the particle deposition rate is greatly lowered. The second problem is that the uniformity of the deposited film is greatly decreased by applying a biasing voltage to the substrate electrode 11. unexamined Japanese patent publication No. 50312/1983 refers to this problem.

It is obvious that these problems provide a large obstacle to the formation of printed circuitry or a dielectric film for a semiconductor device by means of sputtering. Therefore, there is a great need for a sputtering method by which a metallic film having a good step coverage and uniform film thickness can be obtained sufficiently rapidly.

SUMMARY OF THE INVENTION

An object of the present invention is to provide a sputtering apparatus which is capable of solving the above-described conventional problems and in which a metallic film having a superior step coverage and film thickness uniformity can be formed sufficiently rapidly.

To this end, in accordance with the present invention, a lattice-like intermediate electrode including openings each having a large aspect ratio is disposed between a cathode and a substrate electrode within a vacuum chamber, whereby it is possible to enhance step coverage with a resputtering ratio lower than that of the prior art and to greatly improve film thickness uniformity.

DESCRIPTION OF THE PREFERRED EMBODIMENT

Figure 2:
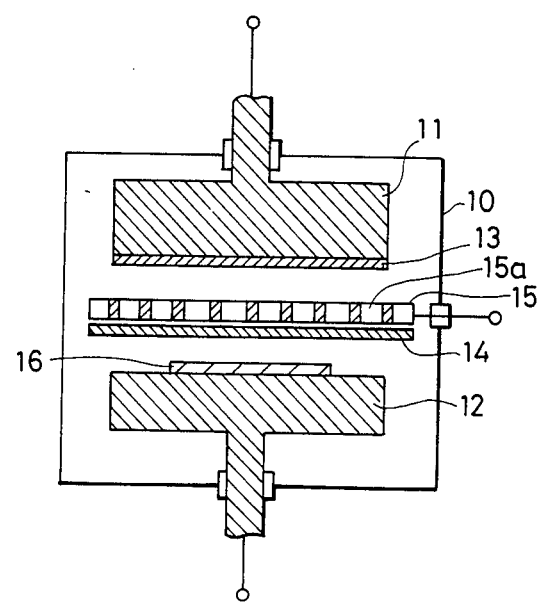
FIG. 2 is a diagrammatic illustration, similar to FIG. 1, of a preferred embodiment of a sputtering apparatus in accordance with the present invention.

FIG. 2 is a diagrammatic illustration of a preferred embodiment of the present invention. As shown in FIG. 2, the cathode 11, the substrate electrode 12, the target 13, a shutter 14 and a lattice-like intermediate electrode 15 with a plurality of holes 15a are disposed within the vacuum chamber 10. The disposition of the intermediate electrode 15 between the cathode 11 and the substrate electrode 12a enables improvements in the uniformity of deposited film thickness and the formation of a metallic film with a resputtering ratio lower than that of the prior art.

Figure 3:
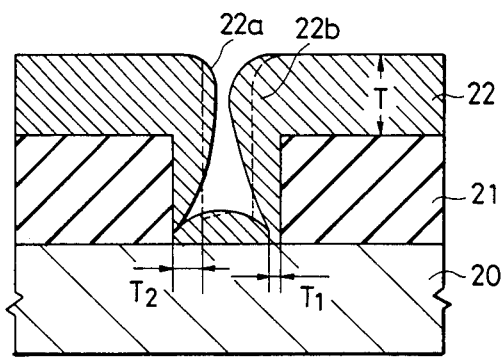
FIGS. 3 and 4 are respectively sectional views schematically showing the effect of the present invention.
Figure 4:
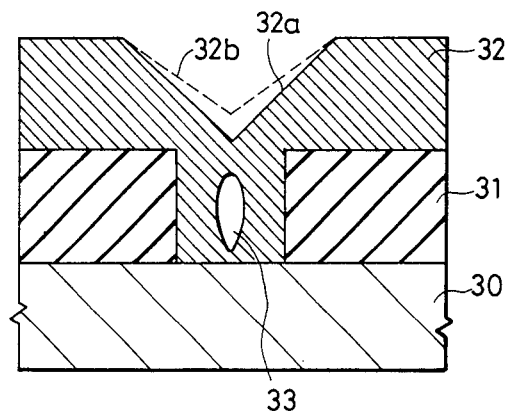

Specifically, it has been found from the present inventor's consideration that the previously-mentioned problems of the prior art are caused by the following main reasons. When a planar magnetron cathode or that of a similar type is employed as the cathode 11, the leakage of a magnetic field from the target 13 exercises an influence upon a surface of the substrate electrode 12 and this changes the distribution of plasma and ions, thereby deteriorating film thickness uniformity. On the other hand, in a normal sputter deposition, the surface of the target 13 adjacent to the corresponding surface of the cathode 11 is negatively biased, whereas plasma is maintained at a zero or slightly positive potential. In contrast, the bias sputtering process is arranged such that a high-frequency voltage is applied to the substrate electrode 12 at the same time when it is applied to the cathode 11 and thus the electrode 12 is negatively biased. The potential of plasma changes at various points between the cathode 11 and the substrate electrode 12, thus resulting in the deterioration of film thickness uniformity. It is considered that the previously-mentioned intermediate electrode 15 has the effect of ameliorating the instability of such a plasma potential and preventing the deterioration of film thickness uniformity. While the intermediate electrode 15 is normally made of metal or its alloys, the intermediate electrode may be at least partially made of a soft magnetic material as required, so that it is possible to further reduce the influence of the magnetic field which leaks out of the cathode 11. In addition, if each of the lattice-like openings in the intermediate electrode 15 is formed to have an aspect ratio of 0.1 or more, the configuration of the deposited film is improved in conventional sputtering and bias sputtering methods, as shown in FIGS. 3 and 4, respectively. This improvement enables the flattening of the deposited film even with a resputtering rate of 20% which is lower than that of the prior art, and it has been confirmed that suitable results can be achieved with a resputtering rate ranging from 20 to 70%. It has also been confirmed that, not only in the bias sputtering method but also in a conventional sputtering method in which no high-frequency electric voltage is applied to a substrate electrode, the step coverage of a deposited film can be greatly improved by the provision of the above-mentioned intermediate electrode 15.

Particles are sputtered out of the target by the kinetic energy generated by ion bombardment, and the particles which are incident substantially perpendicular to the intermediate electrode 15 pass through the openings in the intermediate electrode, and are deposited on the silicon substrate. On the other hand, the particles which are incident on the intermeidate electrode 15 at angles greatly different from such perpendicularity are precluded from passing through the openings by the intermediate electrode 15 per se and do not reach the silicon substrate. It is obvious from the foregoing that the aspect ratio of each of the openings in the intermediate electrode 15 is a remarkably critical factor. Specifically, as the aspect ratio of each opening is increased, the directionality of the particles incident on the silicon substrate becomes more uniform, and this enables the incident particles to reach at angles close to the direction normal to the silicon substrate.

In the present invention, it is preferred that the aspect ratio of each of the openings in the intermediate electrode 15 may be selected within the range of about 0.1 to 3. When the aspect ratio is smaller than 0.1, the effect of the intermediate electrode 15 is reduced, whereas, when this ratio exceeds 3, a film formation rate is remarkably lowered, so that it is difficult to put openings with these aspect ratios to practical use. However, if the aspect ratio of each of the openings in the intermediate electrode 15 is selected within the range of 0.1 to 3, it is possible to smoothly fill sputtered particles into the recesses and grooves each having an aspect ratio of 0.3 (for example, the recesses and grooves each having a depth of 1 $\mu$m and a width of 3 $\mu$m) which are widely used for the formation of 64-kb and 256-kb dRAMs.

EXAMPLE 1

Figure 1:
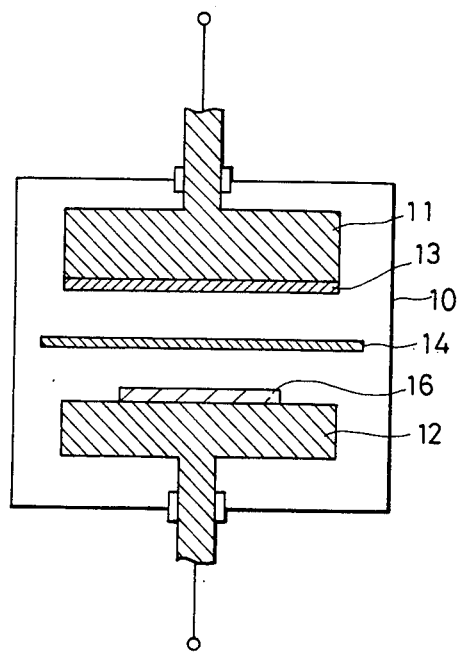
FIG. 1 is a diagrammatic illustration of the essential portion of a bias sputtering apparatus of the prior art.

First, the prior-art apparatus shown in FIG. 1 was used in which the outer diameters of the planar magnetron cathode 11 and the substrate electrode 12 were 15 cm and the distance between the surfaces of the target 13 made of Al and the substrate electrode 12 was 6 cm. A direct current power of 2W/cm$^2$ was applied to the cathode 11, and an Al film having an average thickness of about 1 $\mu$m was thereby formed on the surface of the silicon wafer 16 placed on the substrate electrode 12. In this condition, when an Ar pressure was 0.67Pa, the formation rate of an Al film was about 0.3 $\mu$m/min. Also, the r/R ratio of a diameter r of the region having the Al film thickness which was uniform within an allowable range of ±10% (a substantially circular region) to a diameter R of the substrate electrode was about 0.5.

Secondly, the apparatus of this invention shown in FIG. 2 was used in which the 5-mm thick intermediate electrode 15 including lattice-like openings each having an aspect ratio of 0.3 and an opening ratio of about 80% was disposed as shown in FIG. 2. The intermediate electrode 15 and the substrate electrode 12 were at the same potential, and the two were grounded. On the same conditions as those of the above-described case, with the exception that the intermediate electrode was used, an Al film was formed while the shutter 14 was released. Although the formation rate of the Al film was lowered to about 0.2 $\mu$m/min, the r/R ratio in the ±10% uniform region was greatly improved to about 0.7. When the opening ratio was so adjusted as to increase from the central portion of the intermediate electrode 15 toward the periphery thereof, the r/R ratio was further improved to a range of 0.8 to 0.9. In addition, it was found that the film step coverage on the surface of the silicon wafer 16 was greatly improved.

FIG. 3 is a schematic illustration of the sectional configuration of a deposited Al film 22 within and around a groove in an SiO$_2$ film 21 formed on a silicon wafer 20, comparatively showing changes in the configuration caused by the presence or absence of the intermediate electrode 15. The aspect ratio of the groove was about 1; both the depth and the width were 1 $\mu$m.

When the intermediate electrode was absent, the Al film 22 deposited in the groove was formed in the shape of an overhang as shown in section by a solid line 22a and a sufficient amount of Al was not deposited in the interior of the groove. A step coverage coefficient S, namely, the $T_1/T$ ratio of a thickness $T_1$ of the thinnest portion of the Al film on the sidewall of the groove to a film thickness T of the Al film formed on the flat surface was 0.1 to 0.2 at the most, and this thickness is a problem from the viewpoint of the reliability of Al printed circuitry. In contrast, when the intermediate electrode 15 was disposed within the apparatus, the section of the deposited Al film was formed as shown by a broken line 22b in FIG. 3 and no substantial overhang was found. The step coverage coefficient S which was the ratio of a thickness $T_2$ of the thinnest portion of the Al film in the groove to the film thickness T was greatly improved to about 0.4 and this remarkably enhanced the reliability of Al printed circuitry.

EXAMPLE 2

The arrangement of the apparatus employed and the condition of film formation were substantially the same as those of EXAMPLE 1. However, in EXAMPLE 2, a 13.56-MHz high-frequency power of about 0.6 W/cm$^2$ was applied to the substrate electrode 12 as well. When the intermediate electrode 15 was absent, the film formation rate was approximately 25% lowered from 0.3 to 0.23 μm/min (a resputtering ratio: about 25%) by the application of an electric power to the substrate electrode 12 and the r/R ratio was lowered from 0.5 to 0.2. As shown by a solid line 32a in FIG. 4, the section of an Al film 32 thus obtained was not formed in the shape of an overhang and thus the surface of the Al film 32 was essentially flattened. Nevertheless, a void 33 was formed in the Al film 32 within the groove. In order to eliminate the void 33, the resputtering ratio should preferably be raised to about 50% or more, but the r/R ratio of this case was further reduced and this remarkably narrowed a particle deposition region in which suitable film thickness uniformity was achieved. Next, the intermediate electrode 15 was added to the arrangement of the apparatus, and a radio-frequency power was applied to the substrate electrode 15 in such a manner that the Al film formation rate was approximately 25% lowered from 0.2 to 0.15 μm/min. In consequence, it was successfully possible to maintain the level of r/R≈0.5 and to enhance the r/R ratio to 0.7 by adjusting the opening ratio of each of the lattice-like openings. Incidentally, in FIG. 4, an SiO$_2$ film 31 is formed on an Si wafer 30.

Also, referring to the sectional configuration of the deposited Al film, the flatness of the film surface, as depicted by a broken line 32b in FIG. 4, was not only improved by the use of the intermediate electrode 15, but also the void 33 vanished. It was found that a sufficient flattening effect could be achieved even with a low resputtering ratio and a reliable metal film containing no void could be formed. It should be noted that not a radio-frequency power but a direct current power may be applied to the substrate electrode 12.

EXAMPLE 12

In EXAMPLE 3, an SiO$_2$ film is formed by a bias sputtering method. First, the conventional type of apparatus shown in FIG. 1 was employed in which a high-frequency power of 3.5 W/cm$^2$ was applied to the planar magnetron cathode 11 while that of 0.6 W/cm$^2$ was applied to the substrate electrode 12, thereby forming an SiO$_2$ film. The application of the high-frequency power to the substrate electrode 12 reduced the SiO$_2$ deposition rate from 0.6 μm/min to 0.4 μm/min at a percentage of about 30. The r/R ratio was lowered from 0.7 to 0.2.

Next, a sputtering apparatus was used in which, as shown in FIG. 2, the intermediate electrode 15 was so formed as to include lattice-like openings each having an aspect ratio of 1. In order to maintain the resputtering ratio at the level of 30% with respect to the same cathode voltage as described above, a radio-frequency power of about 0.75 W/cm$^2$ was applied to the substrate electrode 12. The provision of the intermediate electrode 15 greatly improved the r/R ratio to about 0.6. SiO$_2$ particles succeeded in being deposited even in a groove having a small diameter, without forming the void 33 such that as shown in FIG. 4, and thus the interior of the groove was able to be filled with sputtered SiO$_2$.

In the above-described preferred embodiment, although the intermediate electrode 15 having lattice-like openings is used, each of the openings may be formed in the shape of a circle, a rectangle or other various configurations.

Incidentally, it will readily be understood by those skilled in the art that, although FIGS. 1 and 2 schematically show sputtering apparatus in which portions having no direct relationship with the present invention are omitted, an actual sputtering apparatus includes various known means required to effect sputtering, such as means for introducing gas into the vacuum chamber 10 and for evacuating the interior of the chamber 10.

As will be evident from the above description, in accordance with the present invention, film thickness uniformity can be greatly improved as compared with the prior-art sputtering apparatus. The suitable adjustment of the opening ratio of each of the openings in the intermediate electrode 15 further improves such film thickness uniformity. Furthermore, the suitable selection of the aspect ratio of each of the openings in the intermediate electrode 15 improves the step coverage of a deposited film. Specifically, it has been found that, in a bias sputtering process, even if a film is deposited with a lower resputtering ratio than that of the prior art, a sufficient flattening effect can be achieved and the formation of voids can be prevented. The positional relationship between the shutter 14 and the intermediate electrode 15 is not exclusive. However, the disposition of the intermediate electrode 15 closer to the cathode 11 than to the shutter 14 provides an advantage in that a film is somewhat prevented from being separated from the clinging surface of the shutter 14.

As described above, each of the openings in the intermediate electrode 15 may be formed in the shape of a circle or a given polygon such as a square. Also, the effect of improving step coverage can be provided when the aspect ratio of each of the openings in the intermediate electrode 15 is 0.1 or more. The larger the aspect ratio, the more remarkable the improvement effect. However, since an excessively large aspect ratio tends to cause a decrease in deposition rate, the ratio may suitably be selected within a range of 0.1 to 3 as desired. Normally, if the aspect ratio is selected within a range from 0.3 to 1.0, a particularly suitable result can be achieved. Incidentally, not only Al and alloys containing Al as a principal component but also substantially all kinds of metal, such as transition metals, alloys, intermetallic compounds and metal silicides may be applied to the formation of a film made of a conductive material. Also, oxides and nitrides of such as Ta, Ti, Cr and Al, in addition to SiO$_2$, SiN and Al$_2$O$_3$ may be applied to the formation of a dielectric film.

It should be noted that a low-melting-point material such as Al was capable of being formed into a film having a further smooth flatness by cooling the intermediate electrode 15. Conversely, an SiO$_2$ film having a good step coverage and high quality was achieved by heating the intermediate electrode 15. Also, when the intermediate electrode 15 was heated prior to or during the film deposition, it was possible to provide the effects of more effectively discharging impurity gas from the vacuum chamber and enlarging the diameter of each particle of the crystal constituting the film. It will be appreciated that the same effect can be provided not only when using a planar magnetron cathode but also when using a conventional type of cathode. Incidentally, although the effect of improving step coverage can be provided on condition that the aspect ratio of each of the openings in the intermediate electrode 15 is 0.1 or more, aspect ratios of 0.3 or more are further preferred.

Moreover, when the apparatus is applied to the formation of a dielectric film such as SiO$_2$, a high-frequency power superposed on a direct current power is applied across the intermediate electrode 15 and at least either the cathode or the substrate electrode, whereby it is possible to relatively maintain the surface of the intermediate electrode 15 at a given potential.

What is claimed is:

1. A sputtering apparatus comprising:
    a cathode disposed within a vacuum chamber;
    a substrate electrode disposed in face-to-face relationship with said cathode; and
    an intermediate electrode disposed between said cathode and said substrate electrode and including a plurality of openings, each of said openings having an aspect ratio between 0.1 and 3.0;
    wherein ions are made to collide against a target disposed on said cathode so as to liberate particles of materials of which said target is composed, thereby depositing a thin film on a substrate disposed on said substrate electrode.

2. A sputtering apparatus according to claim 1, wherein the aspect ratio of each of said openings in said intermediate electrode is 0.3 to 1.0.

3. A sputtering apparatus according to claim 1, wherein said target is connected to either a direct current electric power source or a high frequency electric power source.

4. A sputtering apparatus according to claim 1, wherein said cathode is of a planar magnetron type.

5. A sputtering apparatus according to claim 1, wherein said substrate electrode is provided with either a high frequency or direct current electric power source.

6. A sputtering apparatus according to claim 1, wherein shutter means is further disposed between said cathode and said substrate electrode.

7. A sputtering apparatus according to claim 6, wherein said shutter means is disposed between said intermediate electrode and said substrate electrode.

8. A sputtering apparatus according to claim 1, wherein said intermediate electrode includes lattice-like openings.

9. A sputtering apparatus according to claim 1, wherein said intermediate electrode is made of either metal or alloys thereof.

10. A sputtering apparatus at least comprising:
    a cathode disposed within a vacuum chamber;
    a substrate electrode disposed in face-to-face relationship with said cathode; and
    an intermediate electrode disposed between said cathode and said substrate electrode and including a plurality of openings, said intermediate electrode is made of either metals or alloys thereof and is at least partially made of a soft magnetic material,
    wherein ions are made to collide against a target disposed on said cathode so as to liberate particles of materials of which said target is composed, thereby depositing a thin film on a substrate disposed on said substrate electrode.

11. A sputtering apparatus at least comprising:
    a cathode disposed within a vacuum chamber;
    a substrate electrode disposed in face-to-face relationship with said cathode;
    an intermediate electrode disposed between said cathode and said substrate electrode and including a plurality of openings; and
    means for heating said intermediate electrode,
    wherein ions are made to collide against a target disposed on said cathode so as to liberate particles of materials of which said target is composed, thereby depositing a thin film on a substrate disposed on said substrate electrode.

* * * * *